(12) United States Patent
Fujiwara (10) Patent No.: US 7,551,010 B2
(45) Date of Patent: Jun. 23, 2009

(54) PLL CIRCUIT AND DESIGN METHOD THEREOF

(75) Inventor: Genichi Fujiwara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/817,502

(22) PCT Filed: May 12, 2005

(86) PCT No.: PCT/JP2005/008722

§ 371 (c)(1),
(2), (4) Date: Aug. 31, 2007

(87) PCT Pub. No.: WO2006/120746

PCT Pub. Date: Nov. 16, 2006

(65) Prior Publication Data

US 2008/0143398 A1    Jun. 19, 2008

(51) Int. Cl.
*H03L 7/06* (2006.01)
(52) U.S. Cl. .................................. 327/156; 327/147
(58) Field of Classification Search .............. None
See application file for complete search history.

(56) References Cited

U.S. PATENT DOCUMENTS

| 4,987,373 | A | * | 1/1991 | Soo | ............................. 327/145 |
| 5,317,202 | A | * | 5/1994 | Waizman | ...................... 327/156 |
| 5,534,822 | A | * | 7/1996 | Taniguchi et al. | ............... 331/2 |
| 6,556,086 | B2 | * | 4/2003 | Keaveney et al. | ........... 331/1 A |
| 6,566,964 | B1 | * | 5/2003 | Hirano | ....................... 331/1 A |
| 6,816,019 | B2 | * | 11/2004 | Delbo' et al. | .................. 331/17 |
| 7,039,149 | B2 | * | 5/2006 | Tagami | ......................... 375/376 |
| 2003/0215039 | A1 | * | 11/2003 | Block et al. | .................. 375/376 |
| 2007/0201594 | A1 | | 8/2007 | Fujiwara | |

FOREIGN PATENT DOCUMENTS

| JP | 6 291655 | 10/1994 |
| JP | 2004 40227 | 2/2004 |

OTHER PUBLICATIONS

Hagiwara, M. et al.,"Practical Use PLL Frequency Synthesizer", ISBN 4-915449-75-0 C3055, pp. 7-13, 1995. (With Partial English Translation).
U.S. Appl. No. 11/817,502, filed Aug. 31, 2007, Fujiwara.

* cited by examiner

*Primary Examiner*—Cassandra Cox
(74) *Attorney, Agent, or Firm*—Oblon, Spivak, McClelland, Maier & Neustadt, P.C.

(57) ABSTRACT

A PLL circuit has an averaging device for averaging a rectangular wave signal output from a phase comparator at every period of a reference clock signal, and for outputting the average value. After the establishment of the phase synchronization of the PLL circuit, the average value of the averaging device becomes a stationary reference level. Accordingly, the output clock signal generated by a voltage controlled oscillator can reduce its output frequency fluctuations in accordance with the reference level.

4 Claims, 7 Drawing Sheets

PLL CIRCUIT AND DESIGN METHOD THEREOF

TECHNICAL FIELD

The present invention relates to a PLL circuit and its design method, which PLL circuit is for generating an output clock signal corresponding to the phase difference between a reference clock signal and a comparison clock signal.

BACKGROUND ART

A conventional PLL circuit has a phase comparator that makes equal the rectangular wave signal time width of a high voltage level and that of a low voltage level when the output signal of the phase comparison has no phase difference because the time difference between the time width of the high voltage level rectangular wave signal and the time width of the low voltage level rectangular wave signal is proportional to the phase difference. In addition, it omits a loop filter that has been necessary previously, and has, at a portion in which the loop filter is mounted in a prior PLL circuit, a waveform shaping circuit that operates in such a manner that the output signal waveform from the phase comparator circuit holds a rectangular shape (see Patent Document 1, for example).

Patent Document 1: Japanese patent application laid-open No. 2004-40227.

With the foregoing configuration, as for the phase difference between the reference clock signal and the comparison clock signal, the conventional PLL circuit can eliminate the phase difference within the phase comparison period. As for the frequency difference between the reference clock signal and the comparison clock signal, however, it has a problem in that the frequency of the comparison clock signal, that is, the frequency of the output clock signal of a voltage controlled oscillator, varies within the phase comparison period.

In addition, in a design method of the conventional PLL circuit, there is a problem in that since the frequency of the output clock signal varies, it is difficult to make the numerical expression of the capturing process of the frequency.

The present invention is implemented to solve the foregoing problems. Therefore it is an object of the present invention to provide a PLL circuit with small output frequency fluctuations in the steady state.

Another object of the present invention is to provide a design method of the PLL circuit capable of designing a high performance PLL circuit with easy circuit response analysis.

DISCLOSURE OF THE INVENTION

The PLL circuit in accordance with the present invention includes: a phase comparator for carrying out phase comparison between a reference clock signal and a comparison clock signal at every period of the reference clock signal, and for outputting a rectangular wave signal that has a reference level as a middle value, and that has a high voltage level or low voltage level corresponding to a phase lead or phase lag, and is provided with a pulse width corresponding to a phase difference; an averaging device for averaging the rectangular wave signal output from the phase comparator at every period of the reference clock signal, and for outputting the average value; and a voltage controlled oscillator to be used in a range, in which a voltage versus frequency characteristic has a linear characteristic, for generating an output clock signal with a frequency corresponding to a voltage value output from the averaging device.

Thus, after the establishment of the phase synchronization of the PLL circuit, the average value of the averaging device becomes a stationary reference level. Accordingly, the PLL circuit has an advantage of enabling the output clock signal generated by a voltage controlled oscillator to reduce its output frequency fluctuations in accordance with the reference level.

BEST MODE FOR CARRYING OUT THE INVENTION

The best mode for carrying out the invention will now be described with reference to the accompanying drawings to explain the present invention in more detail.

Embodiment 1

Figure 1:
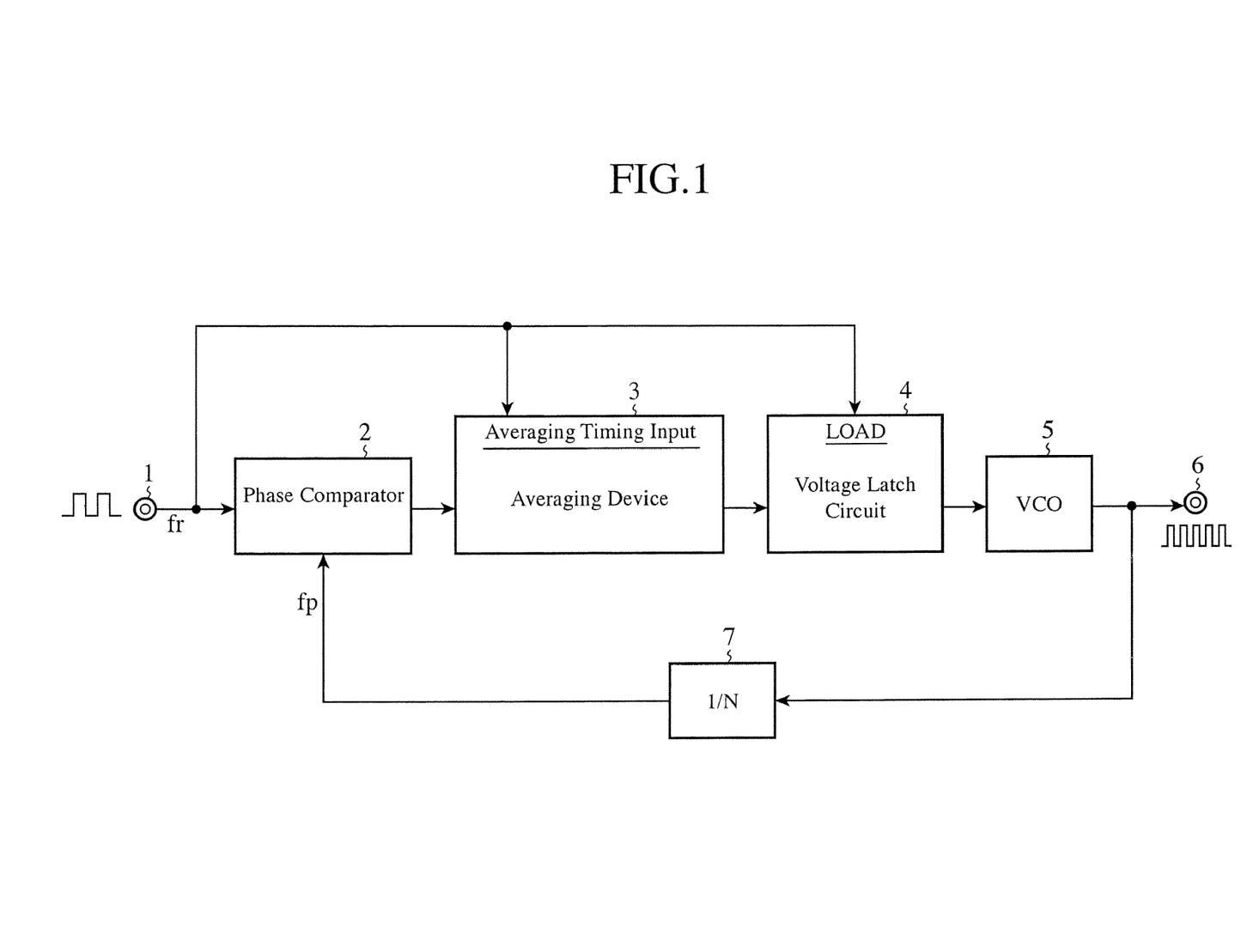
FIG. 1 is a block diagram showing a configuration of the PLL circuit of an embodiment 1 in accordance with the present invention.

FIG. 1 is a block diagram showing a configuration of the PLL circuit of an embodiment 1 in accordance with the present invention. In FIG. 1, a phase comparator 2 carries out the phase comparison between a reference clock signal fr input via a reference clock signal input terminal 1 and a comparison clock signal fp fed back, at every period of the reference clock signal fr; and outputs a rectangular wave signal which makes a reference level Vn a middle value and has two values of a high voltage level VH and a low voltage level VL corresponding to phase lead and phase lag, and in which the pulse width of the high voltage level VH and that of the low voltage level VL are proportional to the phase difference, and are equal when no phase difference is present.

An averaging device 3 averages the rectangular wave signal output from the phase comparator 2 at every period of the reference clock signal fr, and outputs the average value.

A voltage latch circuit 4 reads and outputs the voltage value output from the averaging device 3 in synchronism with the reference clock signal fr, and holds outputting the voltage value until the next reference clock signal fr is input.

A VCO (voltage controlled oscillator) 5, which is used in a range where the voltage versus frequency characteristic is linear, and in which the middle value (Vn) of the voltage value output from the voltage latch circuit 4 is set at the middle value (Vn) in a frequency controllable voltage range, generates the output clock signal with a frequency corresponding to the voltage value output from the voltage latch circuit 4, and outputs it from an output clock signal output terminal 6.

A clock frequency divider 7 divides the output clock signal generated by the VCO 5 by N (N is a natural number), and feeds the resultant signal back to the phase comparator 2 as the comparison clock signal fp.

Figure 2:
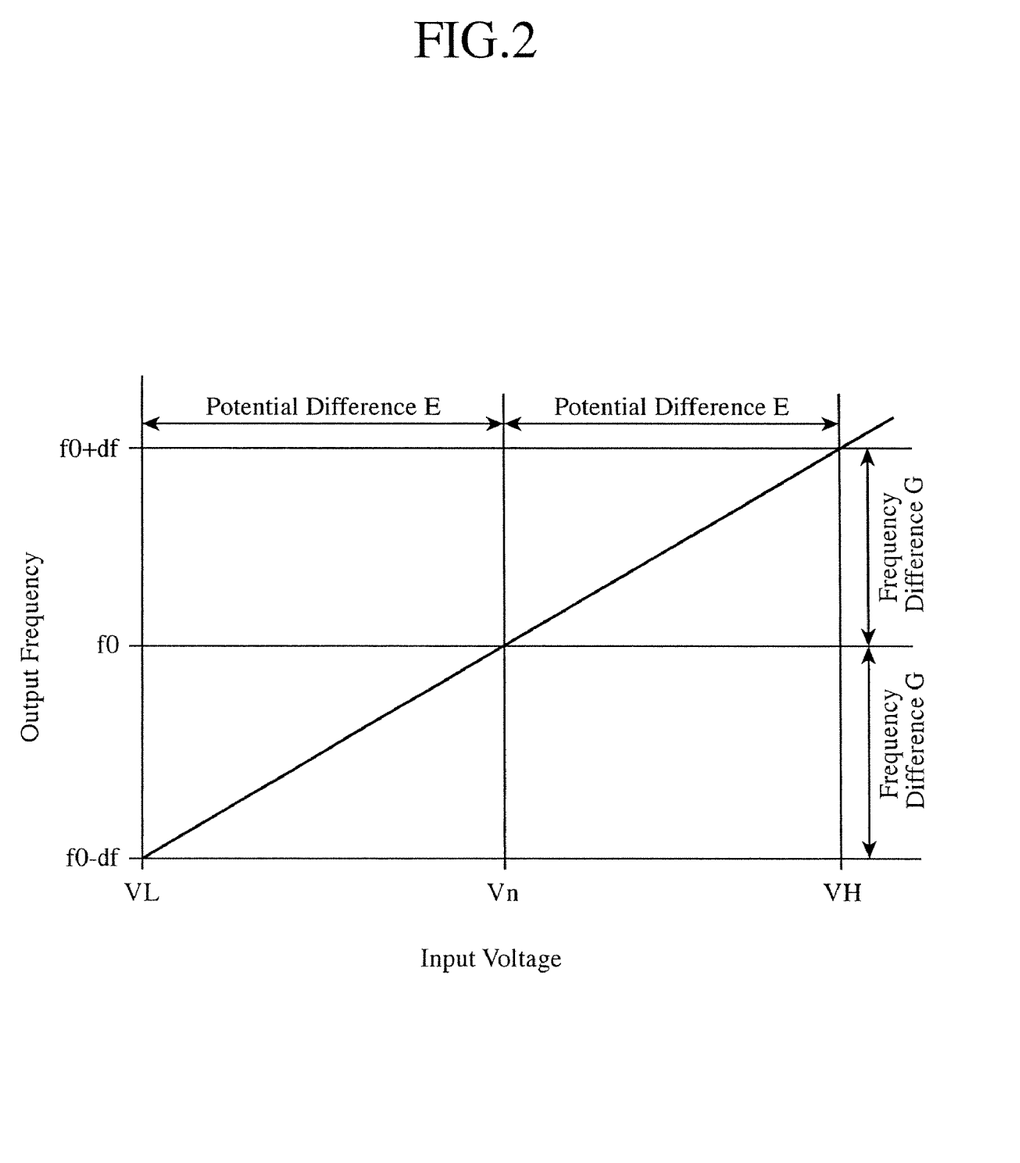
FIG. 2 is a characteristic diagram illustrating a VCO input voltage versus output frequency characteristic of the embodiment 1 in accordance with the present invention.

FIG. 2 is a characteristic diagram illustrating VCO input voltage versus output frequency characteristic of the embodiment 1 in accordance with the present invention. It is assumed that the input voltage versus output frequency characteristic of the VCO 5 is used within its linear characteristic range as shown in FIG. 2. In FIG. 2, assuming that the change g from the output frequency f0 becomes a function g(v) of the input voltage v, it is clear from the characteristic diagram of FIG. 2 that the following expressions hold:

$$|VH-Vn|=|VL-Vn|=E \text{ (constant)}$$

$$g(VH-Vn)=-g(VL-Vn)=df, \text{ and } g(0)=0 \tag{1}$$

Thus, $$df=G \text{ (constant)} \tag{2}$$

Accordingly, the voltage versus frequency sensitivity K of the VCO 5 is given by $$K=G/E \text{ (constant)} \tag{3}$$

By using K, the output frequency y when the input to the VCO 5 is Vn+x is given by $$y=f0+g(x)=f0+Kx \tag{4}$$

Here, frequency relationships in the steady state are given by f0=N×fr and fr=fp, where N is a positive improper fraction including a natural number.

Figure 3:
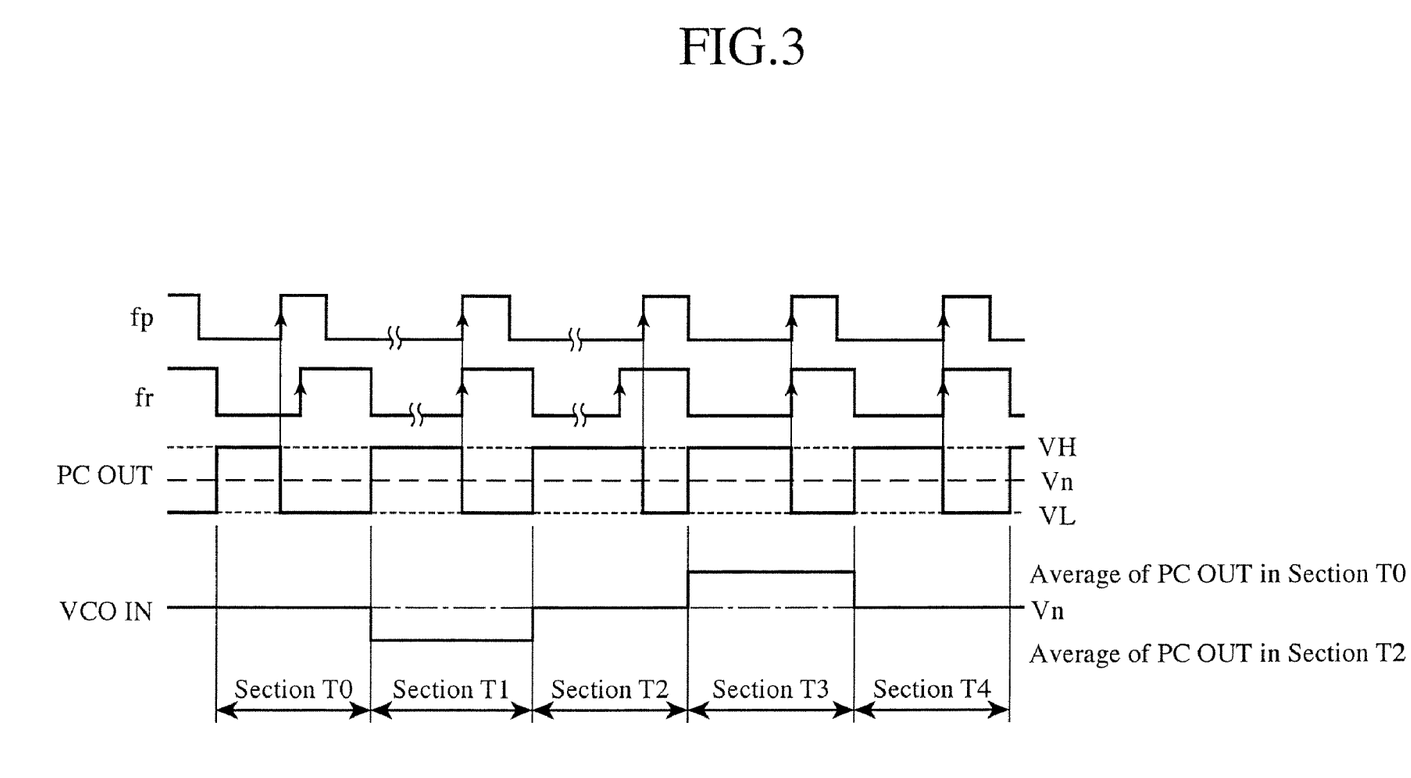
FIG. 3 is a timing chart illustrating basic operation of a phase comparator, averaging device and voltage latch circuit of the embodiment 1 in accordance with the present invention.
Figure 4:
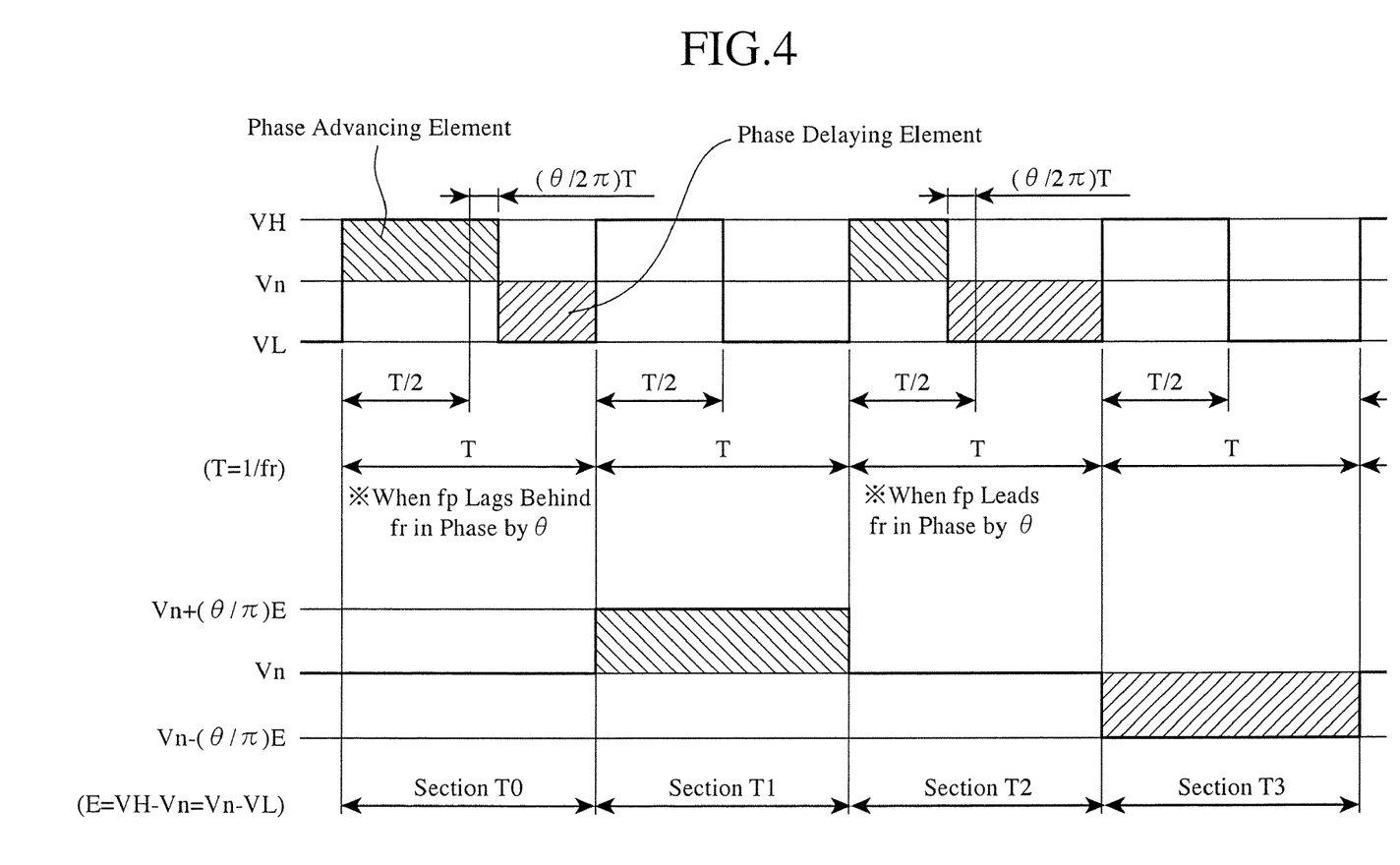
FIG. 4 is a waveform diagram illustrating the basic operation of the phase comparator, averaging device and voltage latch circuit of the embodiment 1 in accordance with the present invention.

FIG. 3 is a timing chart illustrating basic operation of the phase comparator, averaging device and voltage latch circuit of the embodiment 1 in accordance with the present invention; and FIG. 4 is a waveform diagram illustrating the basic operation of the phase comparator, averaging device and voltage latch circuit of the embodiment 1 in accordance with the present invention.

Next, the operation will be described.

In FIG. 1, the reference clock signal fr input via the reference clock signal input terminal 1 is supplied to the phase comparator 2. In addition, the output clock signal from the VCO 5 is divided into 1/N with the clock frequency divider 7, and is supplied to the phase comparator 2 as the comparison clock signal fp.

Subsequently, the phase comparator 2 carries out the phase comparison between the input reference clock signal fr and the comparison clock signal fp, and outputs a rectangular wave signal that adjusts the pulse width of the high voltage level VH and that of the low voltage level VL to the phase difference as a phase difference detection signal.

Here, the output of the phase comparator 2 is assumed as follows.

The high voltage level VH is a potential higher than the reference level Vn, and the low voltage level VL is a potential lower than the reference level Vn. Besides, the high voltage level VH and low voltage level VL are assumed to be potentials having the same absolute value as to the difference between them and the reference level Vn, and opposite signs. Accordingly, $$VH-Vn=E \text{ (constant)} \tag{5}$$

$$VL-Vn=-E \text{ (constant)} \tag{6}$$

where E>0.

Here, in the output of the phase comparator 2 to be supplied to the averaging device 3, the phase difference to be added or eliminated during a single period of the reference clock signal fr can be read in terms of the pulse width of the high voltage level VH or the pulse width of the low voltage level VL of the rectangular wave signal; and the averaging device 3 calculates the time average of the phase difference in the single period of the reference clock signal fr.

The voltage latch circuit 4 latches the output value of the averaging device 3 at LOAD signal input timing, and supplies it to the VCO 5 as a control voltage input.

FIG. 3 shows a basic operation example of the phase comparator 2, averaging device 3 and voltage latch circuit 4. In FIG. 3, the single period of the reference clock signal fr during which the averaging device 3 calculates the time average is defined as the time from a falling edge of the reference clock signal fr to the next falling edge. As for the LOAD signal input indicating the latch timing of the voltage latch circuit 4, the falling edge of the reference clock signal fr is also used, and the voltage latch circuit 4 holds the input voltage value at the previous LOAD signal input point as the output until the LOAD signal is input at the next falling edge.

In response to the control voltage fed from the voltage latch circuit 4, the output clock signal from the VCO 5 is output through the clock signal output terminal 6 as the output from the PLL circuit on the one hand, and is branched to be supplied to the clock frequency divider 7 on the other to be fed back to the phase comparator 2 again as the divided-by-N comparison clock signal fp.

As for the output of the phase comparator 2 in the PLL circuit of the present embodiment 1 after the phase synchronization has been established, the pulse width of the high voltage level VH equals the pulse width of the low voltage level VL. Thus, the time average during the period of the reference clock signal fr obtained by the averaging device 3 becomes the reference level Vn, and the output of the voltage latch circuit 4 which receives it becomes the stationary reference level Vn of the VCO 5. Accordingly, it can be predicted that the output from the VCO 5, that is, the output clock signal of the PLL circuit, becomes the clock output with little frequency fluctuations.

In the present embodiment 1, the operation as the PLL is described not in a transfer function, but in a sequence of the phase adjustment amounts during a single period of the reference clock signal fr. For example, when the phase comparator 2 detects that the comparison clock signal fp leads the reference clock signal fr by θ in the phase, or that the comparison clock signal fp lags behind the reference clock signal fr by θ in the phase, the detection signal waveform becomes as shown in FIG. 4. When looking at the high voltage level VH and low voltage level VL of the rectangular wave signal with respect to the reference line Vn, it is seen from the input voltage versus output frequency characteristic of FIG. 2 that the high voltage level VH works as a phase advancing element and the low voltage level VL works as a phase delaying element as shown in FIG. 4.

When the phase comparator 2 detects the phase lag of θ of the comparison clock signal fp against the reference clock signal fr, as for the output of the phase comparator 2 in the single period of the reference clock signal fr, the phase advancing element is greater than the phase delaying element in the section T0 shown in FIG. 4. The averaging device 3 converts it to the time average value in the single period of the reference clock signal fr, and then the voltage latch circuit 4 holds the time average value during the section T1 of FIG. 4 as the control voltage input to the VCO 5. In this way, the phase of the comparison clock signal fp can be advanced by the amount proportional to the phase difference θ between the reference clock signal fr and the comparison clock signal fp.

When the phase comparator 2 detects the phase lead of θ of the comparison clock signal fp against the reference clock signal fr, as for the output of the phase comparator 2 in the single period of the reference clock signal fr, the phase advancing element is less than the phase delaying element in the section T2 shown in FIG. 4. The averaging device 3 converts it to the time average value in the single period of the reference clock signal fr, and then the voltage latch circuit 4 holds the time average value during the section T3 of FIG. 4 as the control voltage input to the VCO 5. In this way, the phase of the comparison clock signal fp can be delayed by the amount proportional to the phase difference θ between the reference clock signal fr and the comparison clock signal fp.

We created a mathematical model for describing the circuit operation quantitatively.

Assume that at time t=0 the phase difference between the reference clock signal fr and the comparison clock signal fp is θ, then the phase difference φ (t) at time t>0 is given by the following expression (7).

$$\psi(t) = \theta - \frac{1}{N} \cdot \int_0^t g(v(x)) dx \qquad (7)$$

It is assume here that the period of the reference clock signal fr is T (T=1/f0 because the frequency of the reference clock signal fr is f0)

Assume that at time t=(n−1)T the phase difference between the reference clock signal fr and the comparison clock signal fp (which is obtained by subtracting the phase of the comparison clock signal fp from the phase of the reference clock signal fr) is $\theta_{n-1}$, and that at time t=nT the phase difference between the reference clock signal fr and the comparison clock signal fp is θ n. Then, using a step function U(t) expressed as $$U(t) = \begin{cases} 1, & t > 0 \\ 0, & t < 0 \end{cases} \qquad (8)$$

the control voltage v(t) input to the VCO 5 during the time nT<t<(n+1)T is given by the following expression (9) when the comparison clock signal fp lags behind the reference clock signal fr in phase ($\theta_{n-1}$>0).

$$v(t) = V_n + \frac{\theta_{n-1}}{\pi} E \cdot U(t - nT) - \frac{\theta_{n-1}}{\pi} E \cdot U(t - (n+1)T). \qquad (9)$$

It is equivalent to $$v(t) = V_n + \frac{\theta_{n-1}}{\pi} E \quad \text{(where } nT < t \leq (n+1)T) \qquad (10)$$

Substituting v(t) into g(v) to transform g to a function of time t, $$g(t) = K \cdot [v(t) - V_n] = \frac{\theta_{n-1}}{\pi} G \quad \text{(where } nT < t \leq (n+1)T) \qquad (11)$$

When obtaining the function g of time t when the comparison clock signal fp leads the reference clock signal fr in phase ($\theta_{n-1}$<0), it agrees exactly with the foregoing expression (11).

Accordingly, the amount of change g(t) in the frequency during the time nT<t≦(n+1)T is given by the following expression (12) using the step function in both the cases where ($\theta_{n-1}$>0) and ($\theta_{n-1}$<0).

$$g(t) = \frac{\theta_{n-1}}{\pi} \cdot G \cdot [U(t - nT) - U(t - (n+1)T] \qquad (12)$$

Using it, the phase difference $\theta_{n+1}$ at t=(n+1)T is calculated as $$\theta_{n+1} = \psi[(n+1)T] = \theta - \frac{G \cdot T}{\pi \cdot N} \cdot \sum_{k=0}^{n-1} \theta_k \qquad (13)$$

From this, the following recurrence relation is obtained.

$$\theta_{n+2} = \theta_{n+1} - \frac{G \cdot T}{\pi \cdot N} \cdot \theta_n \qquad (14)$$

It becomes the mathematical model representing phase difference changes at each period T.

In addition, using $\theta_{n-1}$ obtained from the foregoing expression, the frequency changes at each period T can also be obtained from the foregoing g(t).

Incidentally, conditions for convergence of the sequence are also lockup conditions of the PLL circuit of the present embodiment 1. Thus, the following expression must be satisfied.

$$0 < \frac{G \cdot T}{\pi \cdot N} < \frac{1}{4} \qquad (15)$$

Conversely, it shows that as long as the foregoing conditions are satisfied, the lockup is achieved without fail regardless of the initial (time t=0) value of the phase difference θ.

Thus, using the mathematical model of the present embodiment 1 makes it possible to grasp the response operation of the PLL circuit of the embodiment 1 to the step phase input together with the changes in the phase difference and frequency, and to design the lockup time.

In this way, according to the PLL circuit of the embodiment 1, after the phase synchronization has been established, since the input to the VCO 5 is the stationary reference level Vn only, the frequency of the output clock signal of the PLL circuit enters a state having little fluctuations.

In addition, an advantage of the conventional PLL circuit continues that once the phase convergence condition $$|\theta_n| < \epsilon \qquad (16)$$

(where ε is the maximum value of the allowable phase difference after the phase synchronization has been established)

is determined, the convergence speed can also be calculated directly from n that satisfies it, and is given by n×T.

As described above, according to the present embodiment 1, after the establishment of the phase synchronization of the PLL circuit, the average value obtained by the averaging device 3 becomes the stationary reference level. Accordingly, the output clock signal created by the VCO 5 can reduce the output frequency fluctuations in response to the reference level Vn.

In addition, providing the voltage latch circuit 4 makes it possible to keep the reference level Vn input to the VCO 5 more stable after the establishment of the phase synchronization of the PLL circuit, thereby being able to reduce the output frequency fluctuations.

Furthermore, since the reference clock signal fr is only one clock signal, it is not necessary to handle two types of reference clock signals, which enables a simpler circuit configuration.

Moreover, using the mathematical model represented in terms of a sequence for the response of the PLL circuit enables grasping the response operation of the PLL circuit to the step phase input together with the changes in the phase difference and frequency, and enables the design of the lockup time as well.

Embodiment 2

Figure 5:
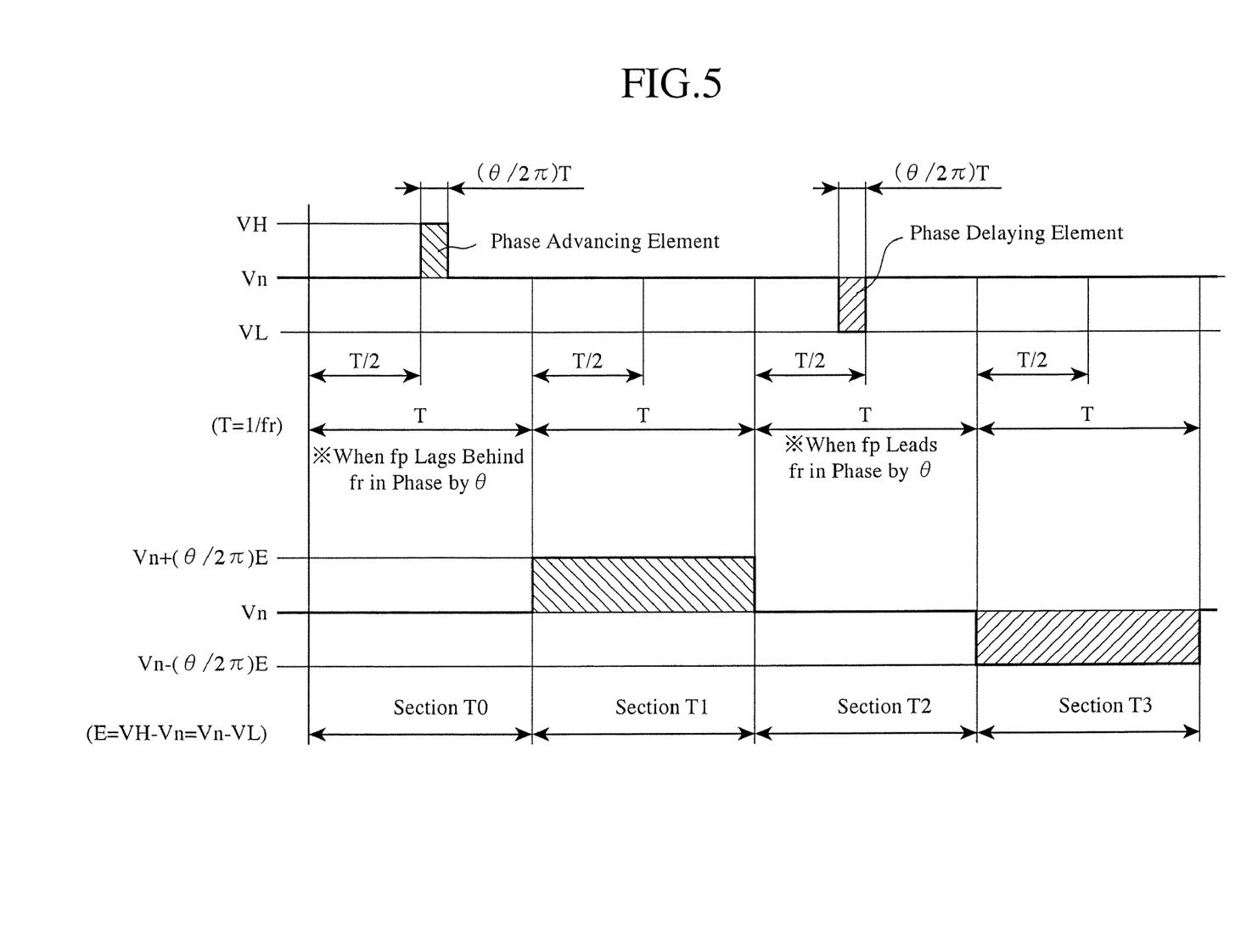
FIG. 5 is a waveform diagram illustrating the basic operation of the phase comparator, averaging device and voltage latch circuit of an embodiment 2 in accordance with the present invention.

FIG. 5 is a waveform diagram illustrating a basic operation of the phase comparator, averaging device and voltage latch circuit of an embodiment 2 in accordance with the present invention.

In FIG. 5, the phase comparator 2 carries out the phase comparison between the reference clock signal fr input via the reference clock signal input terminal 1 and the comparison clock signal fp fed back, at every period of the reference clock signal fr; and outputs the rectangular wave signal which makes the reference level Vn the middle value and has two values of the high voltage level VH and the low voltage level VL corresponding to phase lead and phase lag, and in which the pulse width of the high voltage level VH and that of the low voltage level VL are proportional to the phase difference, and are eliminated when no phase difference is present.

According to the foregoing embodiment 1 as shown in FIG. 4, when the comparison clock signal fp lags behind the reference clock signal fr by the phase θ, the phase comparator 2 makes the pulse width of the high voltage level VH (phase advancing element) wider by the phase θ, and the pulse width of the voltage level VL (phase delaying element) narrower by the phase θ. In contrast, when the comparison clock signal fp leads the reference clock signal fr by the phase θ, the phase comparator 2 makes the pulse width of the high voltage level VH (phase advancing element) narrower by the phase θ, and the pulse width of the voltage level VL (phase delaying element) wider by the phase θ.

According to the present embodiment 2 as shown in FIG. 5, when the comparison clock signal fp lags behind the reference clock signal fr by the phase θ, the phase comparator 2 makes the pulse width of the high voltage level VH (phase advancing element) equal to an amount corresponding to the phase θ, and when the comparison clock signal fp leads the reference clock signal fr by the phase θ, the phase comparator 2 makes the pulse width of the low voltage level VL (phase delaying element) equal to the amount corresponding to the phase θ.

In the present embodiment 2 also, the averaging device 3 averages the rectangular wave signal output from the phase comparator 2 at every period of the reference clock signal fr, and outputs the average value; and the voltage latch circuit 4 reads and outputs the voltage value output from the averaging device 3 in synchronism with the reference clock signal fr, and holds outputting the voltage value until the next reference clock signal fr is input.

As described above, according to the present embodiment 2, after the establishment of the phase synchronization of the PLL circuit, the average value obtained by the averaging device 3 becomes the stationary reference level. Accordingly, the output clock signal created by the VCO 5 can reduce the output frequency fluctuations in response to the reference level Vn.

In addition, providing the voltage latch circuit 4 makes it possible to keep the reference level Vn input to the VCO 5 more stable after the establishment of the phase synchronization of the PLL circuit, thereby being able to reduce the output frequency fluctuations.

The condition for convergence is calculated in the same manner as in the embodiment 1, and is given by $$0 < \frac{G \cdot T}{\pi \cdot N} < \frac{1}{2} \tag{17}$$

Embodiment 3

Figure 6:
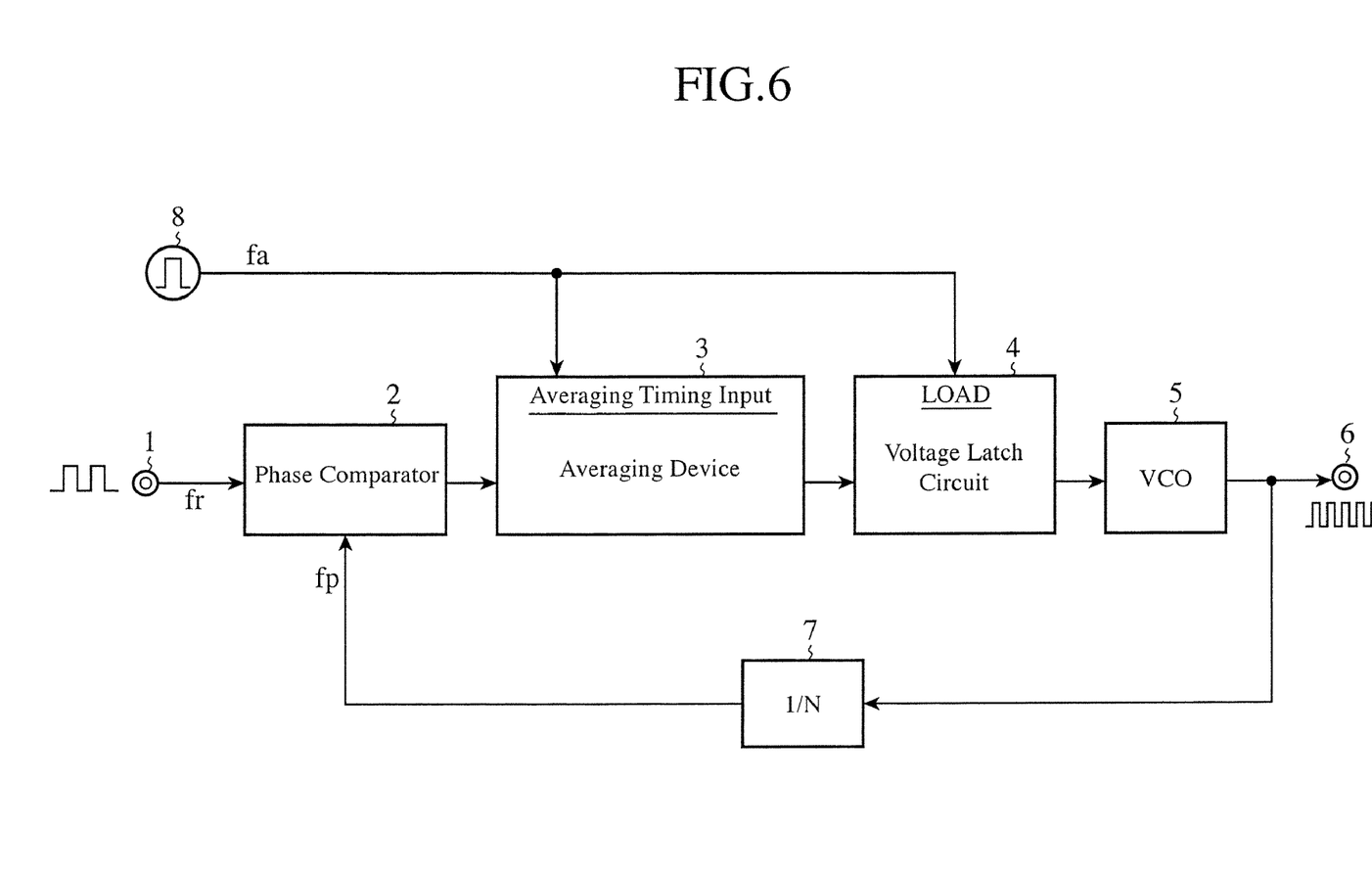
FIG. 6 is a block diagram showing a configuration of the PLL circuit of an embodiment 3 in accordance with the present invention.

FIG. 6 is a block diagram showing a configuration of the PLL circuit of an embodiment 3 in accordance with the present invention. In FIG. 6, an oscillator 8 oscillates a reference clock signal fa different from the reference clock signal fr input to the phase comparator 2. The remaining configuration is the same as that of FIG. 1.

The averaging device 3 according to the foregoing embodiment 1 averages the rectangular wave signal output from the phase comparator 2 at every period of the reference clock signal fr, and outputs the average value; and the voltage latch circuit 4 reads and outputs the voltage value output from the averaging device 3 in synchronism with the reference clock signal fr, and holds outputting the voltage value until the next reference clock signal fr is input.

The averaging device 3 according to the foregoing embodiment 3 averages the rectangular wave signal output from the phase comparator 2 at every period of the reference clock signal fa different from the reference clock signal fr, and outputs the average value; and the voltage latch circuit 4 reads and outputs the voltage value output from the averaging device 3 in synchronism with the reference clock signal fa different from the reference clock signal fr, and holds outputting the voltage value until the next reference clock signal fa is input.

As described above, the present embodiment 3 is configured in such a manner as to operate the averaging device 3 and voltage latch circuit 4 in synchronism with the reference clock signal fa different from the reference clock signal fr input to the phase comparator 2. Thus, it can handle the reference clock signal fr, which is input to the phase comparator 2, and the reference clock signal fa, which is input to the averaging device 3 and voltage latch circuit 4, independently of each other, thereby being able to increase the flexibility of the circuit design.

Embodiment 4

Figure 7:
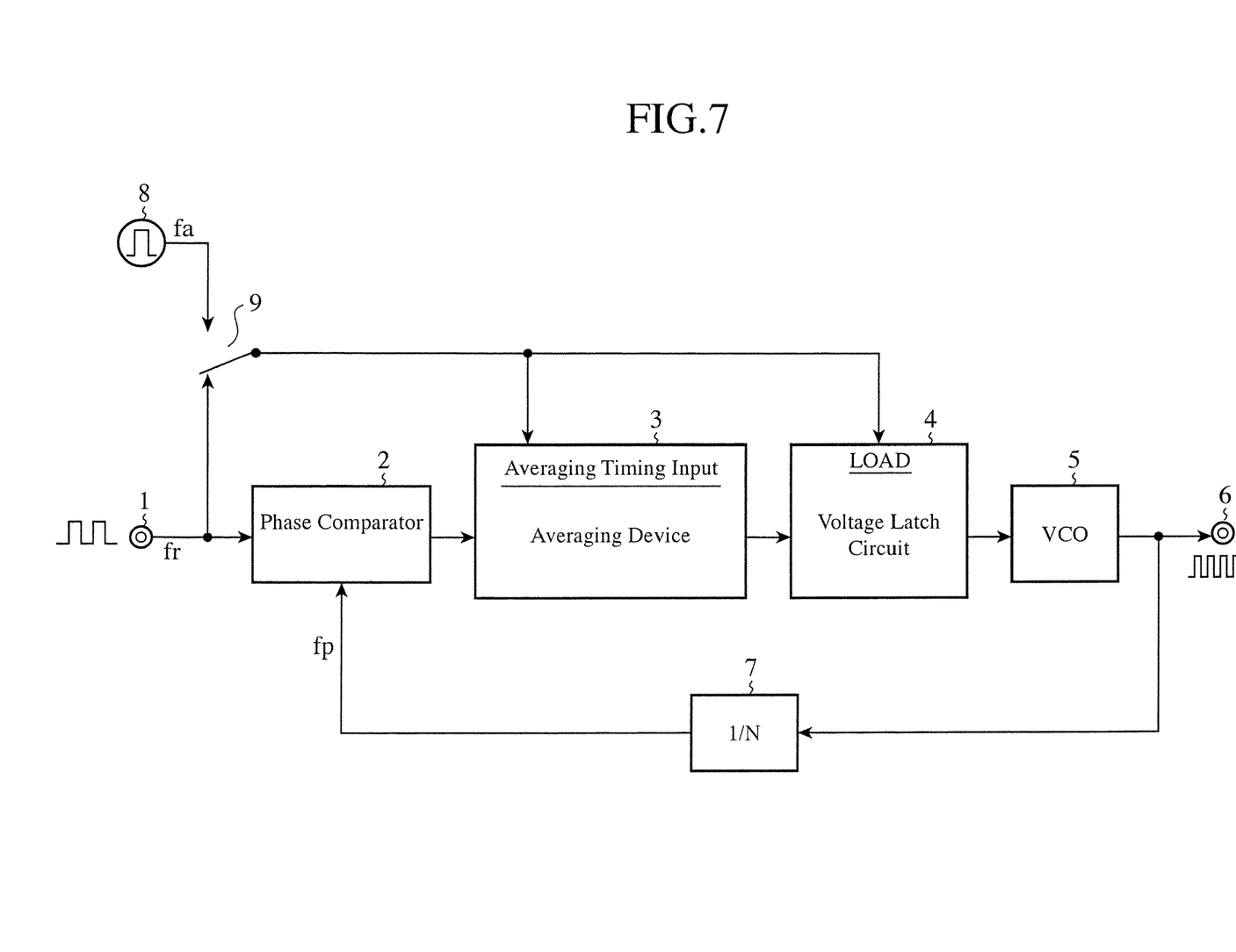
FIG. 7 is a block diagram showing a configuration of the PLL circuit of an embodiment 4 in accordance with the present invention.

FIG. 7 is a block diagram showing a configuration of the PLL circuit of an embodiment 4 in accordance with the present invention. In FIG. 7, a switching circuit 9 enables the reference clock signal input to the averaging device 3 and voltage latch circuit 4 to be switched freely between the reference clock signal fr input to the phase comparator 2 and the second reference clock signal fa. The remaining configuration is the same as that of FIG. 1.

The averaging device 3 and voltage latch circuit 4 according to the foregoing embodiment 3 must carry out their processing in synchronism with the reference clock signal fa fed from the oscillator 8 without a choice of the reference clock signal. The averaging device 3 and voltage latch circuit 4 according to the present embodiment 4 can select either the reference clock signal fr input to the phase comparator 2 or the reference clock signal fa fed from the oscillator 8 with the switching circuit 9, thereby being able to have the choice of the reference clock signal.

As described above, the present embodiment 4 has the switching circuit 9 for switching the reference clock signal to be input to the averaging device 3 and voltage latch circuit 4 freely between the reference clock signal fr input to the phase comparator 2 and the second reference clock signal fa. Accordingly, it can appropriately select the setting of the reference clock signal in accordance with the circuit configuration.

INDUSTRIAL APPLICABILITY

As described above, the PLL circuit in accordance with the present invention is applicable to base stations of mobile phones and the like, for example.

What is claimed is:

1. A PLL circuit comprising:
    a phase comparator for carrying out phase comparison between a reference clock signal and a comparison clock signal at every period of the reference clock signal, and for outputting a rectangular wave signal having a reference level as a middle value, and having a high voltage level or low voltage level corresponding to a phase lead or phase lag, and provided with a pulse width corresponding to a phase difference;
    an averaging device for averaging the rectangular wave signal output from said phase comparator at every period of the reference clock signal, and for outputting the average value;
    a voltage latch circuit for reading the voltage value output from said averaging device synchronously with respect to the reference clock signal while simultaneously supplying the voltage value to a voltage controlled oscillator, and for outputting the voltage value upon input of a next period of the reference clock signal; and
    the voltage controlled oscillator to be used in a range, in which a voltage versus frequency characteristic has a linear characteristic, for generating an output clock signal with a frequency corresponding to a voltage value output from said averaging device, wherein
    a signal obtained by dividing the output clock signal generated by said voltage controlled oscillator by N (N is a natural number) is fed back to said phase comparator as the comparison clock signal.

2. The PLL circuit according to claim 1, wherein said averaging device and voltage latch circuit operate synchronously with respect to out their processing in synchronism with another reference clock signal different from the reference clock signal input to said phase comparator.

3. The PLL circuit according to claim 1, further comprising:
    a switching circuit for switching the reference clock signal to be input to said averaging device; and
    a voltage latch circuit between the reference clock signal input to said phase comparator and another reference clock signal.

4. A PLL method comprising:
    carrying out phase comparison between a reference clock signal and a comparison clock signal at every period of the reference clock signal, and outputting a rectangular wave signal having a reference level as a middle value, and having a high voltage level or low voltage level corresponding to a phase lead or phase lag, and provided with a pulse width corresponding to a phase difference;
    averaging the rectangular wave signal output from said phase comparison at every period of the reference clock signal, and outputting the average value; and
    reading the voltage value output from said averaging synchronously with respect to the reference clock signal while simultaneously supplying the voltage value to a voltage controlled oscillator, and outputting the voltage value upon input of a next period of the reference clock signal, wherein:
    the voltage controlled oscillator is to be used in a range, in which a voltage versus frequency characteristic has a linear characteristic, for generating an output clock signal with a frequency corresponding to a voltage value output during said averaging,
    a signal obtained by dividing the output clock signal generated during said voltage controlled oscillation by N (N is a natural number) is fed back to said phase comparison as the comparison clock signal, and
    said PLL method is carried out in a PLL circuit employing a mathematical model represented by a sequence of phase difference changes at each of subsequent time periods.

* * * * *